(12) United States Patent
Toyota et al.

(10) Patent No.: US 10,791,622 B2
(45) Date of Patent: Sep. 29, 2020

(54) PRINTED WIRING BOARD

(71) Applicants: National University Corporation Okayama University, Okayama-shi, Okayama (JP); KYOCERA Corporation, Kyoto-shi, Kyoto (JP)

(72) Inventors: Yoshitaka Toyota, Oakayama (JP); Kengo Iokibe, Okayama (JP); Xingxiaoyu Lin, Okayama (JP); Toshiyuki Kaneko, Hachioji (JP); Masanori Naito, Fuchu (JP); Toshihisa Uehara, Sagamihara (JP)

(73) Assignees: NATIONAL UNIVERSITY CORPORATION OKAYAMA UNIVERSITY, Okayama (JP); KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/320,392

(22) PCT Filed: Jul. 20, 2017

(86) PCT No.: PCT/JP2017/026326
§ 371 (c)(1),
(2) Date: Jan. 24, 2019

(87) PCT Pub. No.: WO2018/021148
PCT Pub. Date: Feb. 1, 2018

(65) Prior Publication Data
US 2019/0246494 A1    Aug. 8, 2019

(30) Foreign Application Priority Data
Jul. 27, 2016    (JP) .................................. 2016-147672

(51) Int. Cl.
*H05K 1/00*    (2006.01)
*H05K 1/02*    (2006.01)
(Continued)

(52) U.S. Cl.
CPC ............. *H05K 1/0236* (2013.01); *H05K 1/02* (2013.01); *H05K 1/115* (2013.01); *H05K 1/162* (2013.01);
(Continued)

(58) Field of Classification Search
CPC ... H05K 1/00; H05K 1/02; H05K 1/11; H05K 1/16; H05K 1/116; H05K 1/0236;
(Continued)

(56) References Cited

U.S. PATENT DOCUMENTS

| 8,536,960 B2* | 9/2013 | Immonen | H01P 1/2005 333/204 |
| 2005/0029632 A1* | 2/2005 | McKinzie, III | H01P 1/16 257/665 |

(Continued)

FOREIGN PATENT DOCUMENTS

| CN | 101667567 A | 3/2010 |
| CN | 101714681 A | 5/2010 |

(Continued)

*Primary Examiner* — Xiaoliang Chen
(74) *Attorney, Agent, or Firm* — Volpe and Koenig, P.C.

(57) ABSTRACT

A printed wiring board of the present disclosure that includes a power supply layer and a ground layer. A power supply layer pattern formed in the power supply layer includes a power supply layer electrode and a branch that is a direct-current power feeding path connecting adjacent electromagnetic band gap (EBG) unit cells. A capacitive coupling element including a capacitive coupling element body is disposed to oppose the power supply layer electrode with an interlayer provided therebetween.

6 Claims, 5 Drawing Sheets

(51) Int. Cl.
*H05K 1/11* (2006.01)
*H05K 1/16* (2006.01)
*H05K 9/00* (2006.01)
*H01P 1/16* (2006.01)
*H01P 1/20* (2006.01)
*H01P 1/203* (2006.01)
*H01L 31/00* (2006.01)
*H05K 3/46* (2006.01)

(52) U.S. Cl.
CPC .............. *H05K 3/46* (2013.01); *H05K 1/0231* (2013.01); *H05K 2201/093* (2013.01); *H05K 2201/09254* (2013.01)

(58) Field of Classification Search
CPC .. H05K 9/00; H01R 12/04; H01P 1/16; H01P 1/20; H01P 1/203; H01L 31/00
USPC ....... 174/262, 250, 260, 261, 264, 350, 360, 174/377; 361/748, 760, 782, 800, 818; 333/12, 175, 202, 204, 246
See application file for complete search history.

(56) References Cited

U.S. PATENT DOCUMENTS

| | | | | |
|---|---|---|---|---|
| 2005/0224912 | A1* | 10/2005 | Rogers | H01L 23/50 257/532 |
| 2007/0090398 | A1* | 4/2007 | McKinzie, III | H01P 1/20 257/192 |
| 2007/0120223 | A1* | 5/2007 | McKinzie, III | H01P 1/16 257/533 |
| 2007/0289771 | A1* | 12/2007 | Osaka | H01L 23/66 174/250 |
| 2008/0158840 | A1* | 7/2008 | Chen | H05K 1/0236 361/782 |
| 2008/0258993 | A1* | 10/2008 | Gummalla | H01Q 1/243 343/876 |
| 2008/0314630 | A1* | 12/2008 | Kim | H01P 1/2005 174/261 |
| 2008/0314634 | A1* | 12/2008 | Kim | H05K 1/0236 174/264 |
| 2008/0314635 | A1* | 12/2008 | Kim | H01P 1/2005 174/264 |
| 2009/0039984 | A1* | 2/2009 | Kim | H01P 1/2005 333/212 |
| 2009/0135570 | A1* | 5/2009 | Chou | H05K 1/0236 361/782 |
| 2009/0145646 | A1* | 6/2009 | Han | H01P 1/2005 174/260 |
| 2009/0267704 | A1* | 10/2009 | Chang | H03H 1/02 333/175 |
| 2009/0315648 | A1* | 12/2009 | Toyao | H01P 1/2005 333/238 |
| 2009/0322450 | A1* | 12/2009 | Kim | H01P 1/2005 333/204 |
| 2010/0085128 | A1* | 4/2010 | Cho | H01P 1/2005 333/12 |
| 2010/0134212 | A1* | 6/2010 | Kim | H01P 1/20 333/202 |
| 2010/0134213 | A1* | 6/2010 | Kim | H01P 1/2005 333/202 |
| 2010/0180437 | A1* | 7/2010 | McKinzie, III | H01P 1/20 29/825 |
| 2010/0214178 | A1* | 8/2010 | Toyao | H01P 1/2005 343/702 |
| 2010/0252319 | A1* | 10/2010 | Cho | H05K 1/0236 174/377 |
| 2010/0252320 | A1* | 10/2010 | Cho | H05K 1/0236 174/377 |
| 2011/0026234 | A1* | 2/2011 | Kim | H05K 1/0236 361/800 |
| 2011/0031007 | A1* | 2/2011 | Kim | H05K 1/0236 174/377 |
| 2011/0067914 | A1* | 3/2011 | Jung | H05K 1/0236 174/350 |
| 2011/0067915 | A1* | 3/2011 | Kim | H05K 1/0236 174/350 |
| 2011/0067916 | A1* | 3/2011 | Kim | H05K 1/0236 174/350 |
| 2011/0067917 | A1* | 3/2011 | Park | H05K 1/0236 174/350 |
| 2011/0134010 | A1* | 6/2011 | Toyao | H01P 1/2005 343/844 |
| 2011/0170267 | A1* | 7/2011 | Ando | H01Q 9/30 361/748 |
| 2013/0265736 | A1* | 10/2013 | Rokuhara | H05K 9/0064 361/783 |
| 2014/0028412 | A1* | 1/2014 | Sasaki | H03H 7/0138 333/12 |
| 2015/0084167 | A1* | 3/2015 | Sasaki | H01L 24/19 257/659 |
| 2016/0157338 | A1* | 6/2016 | Toyota | H05K 1/0236 361/748 |
| 2017/0127510 | A1* | 5/2017 | Kawata | H05K 1/16 |

FOREIGN PATENT DOCUMENTS

| | | |
|---|---|---|
| JP | 2010-010183 A | 1/2010 |
| JP | 2013-058585 A | 3/2013 |
| JP | 2013-183082 A | 9/2013 |
| JP | 2013-255259 A | 12/2013 |
| JP | 2014-027559 A | 2/2014 |
| KR | 100871346 B1 | 12/2008 |
| TW | 200808136 A | 2/2008 |

\* cited by examiner

PRINTED WIRING BOARD

TECHNICAL FIELD

The present disclosure relates to a printed wiring board having an electromagnetic band gap structure.

BACKGROUND ART

A multilayer printed wiring board having a noise suppression part or noise propagation suppression is considered to be used for suppressing parallel plate resonance or high-frequency noise propagation generated between a power supply layer and a ground layer in the multilayer printed wiring board. Normally a capacitor is used for reducing noises in a power supply system in the multilayer printed wiring board. On the other hand, an electromagnetic band gap (EBG) structure is used between the power supply layer and the ground layer in order to suppress noise propagation. Such printed wiring boards utilizing such an EBG structure are disclosed in, for example, Patent Documents 1 to 5.

RELATED ART DOCUMENT

Patent Document

Patent Document 1: Japanese Unexamined Patent Publication No. 2010-10183
Patent Document 2: Japanese Unexamined Patent Publication No. 2013-58585
Patent Document 3: Japanese Unexamined Patent Publication No. 2013-183082
Patent Document 4: Japanese Unexamined Patent Publication No. 2013-255259
Patent Document 5: Japanese Unexamined Patent Publication No. 2014-27559

SUMMARY OF THE INVENTION

A printed wiring board of the present disclosure includes a power supply layer and a ground layer. A power supply layer pattern to be formed in the power supply layer includes a power supply layer electrode and a branch that is a direct-current power feeding path connecting adjacent EBG unit cells. A capacitive coupling element including a capacitive coupling element body is disposed to oppose the power supply layer electrode with an interlayer being provided between the capacitive coupling element and the power supply layer electrode. The power supply layer pattern further includes a power supply layer wire that extends from the power supply layer electrode to surround at least a portion of a periphery of the electrode, or the capacitive coupling element further includes a capacitive coupling element wire that extends from the capacitive coupling element body to surround at least a portion of a periphery of the body, or the power supply layer pattern further includes the power supply layer wire and the capacitive coupling element further includes the capacitive coupling element wire. The power supply layer pattern and capacitive coupling element form an EBG structure in which EBG unit cells are disposed at regular intervals. The EBG unit cells are connected to each other through a via connected to at least one of the power supply layer wire and the capacitive coupling element wire.

EMBODIMENT FOR CARRYING OUT THE INVENTION

In a capacitor used generally, a noise suppression effect cannot be expected at a few hundred or more MHz due to an influence of an equivalent series inductance (an ESL). Provision of an electromagnetic band gap (EBG) structure on a substrate is effective for the noise propagation suppression at a frequency equal to or more than 1 GHz. However, downsizing of the EBG structure is essential for practical use, and an EBG structure that uses an open stab that is easily downsized is reported. In this EBG structure, a via has to be formed in an interlayer between a power supply layer and a ground layer, and thus this structure is disadvantageous from a viewpoint of a cost. On the other hand, in general an EBG structure where a via is not formed in the interlayer between the power supply layer and the ground layer is hardly downsized.

The EBG structure provided to a printed wiring board of the present disclosure can be further downsized by forming a two-layer structure of a power supply electrode in which a capacitive coupling element is added to a power supply layer even if a via is not formed in the interlayer between the power supply layer and the ground layer. The printed wiring board of the present disclosure will be described in detail below.

Figure 1:
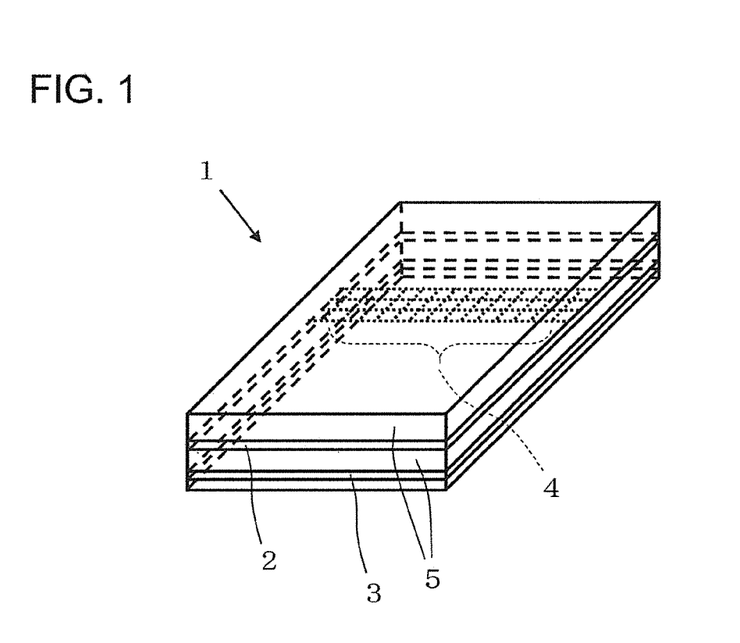
FIG. 1 is an explanatory diagram illustrating a printed wiring board according to one embodiment of the present disclosure.

The printed wiring board according to one embodiment of the present disclosure is illustrated in FIG. 1. A printed wiring board 1 illustrated in FIG. 1 includes a power supply layer 2 and a ground layer 3. The power supply layer 2 partially has an EBG structure 4. The power supply layer 2 and the ground layer 3 are formed by a solid pattern including an electrically conductive material such as copper. A thickness of the power supply layer 2 is not particularly limited, and for example, about 18 to 70 μm. A thickness of the ground layer 3 is also not particularly limited, and for example, about 18 to 70 μm.

An insulating layer 5 is formed between the power supply layer 2 and the ground layer 3, on an upper surface of the power supply layer 2 and on a lower surface of the ground layer 3. The insulating layer 5 is not particularly limited as long as it is formed by an insulating material. Examples of the insulating material are organic resins such as an epoxy resin, a bismaleimide-triazine resin, a polyimide resin, and a polyphenylene ether resin. Two or more kinds of these organic resins may be mixed.

When the organic resin is used as the insulating material, a reinforcement material may be blended to the organic resin. Examples of the reinforcement material are insulating fabric materials such as a glass fiber, a glass nonwoven fabric, an aramid nonwoven fabric, an aramid fiber, and a polyester fiber. Two or more kinds of the reinforcement materials may be used. Further, the insulating material may include an inorganic filler such as silica, barium sulfate, talc, clay, glass, calcium carbonate, or titanium oxide.

Figure 2A:
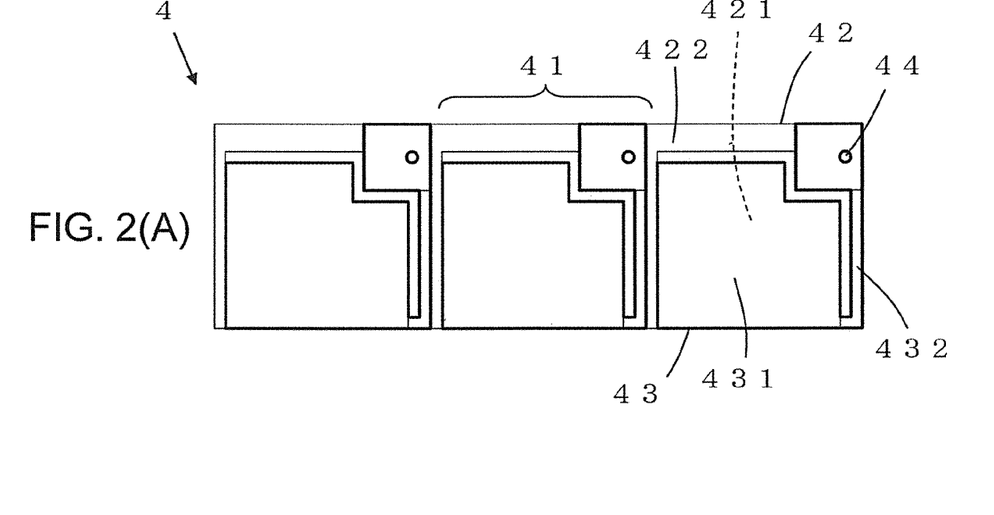
FIG. 2(A) is an explanatory diagram illustrating an EBG structure provided in the printed wiring board illustrated in FIG. 1 according to one embodiment.

In the printed wiring board 1 illustrated in FIG. 1, the power supply layer 2 partially has the EBG structure 4. The EBG structure 4 according to one embodiment will be described with reference to FIGS. 2(A) to 2(C). FIG. 2(A) illustrates a part of the EBG structure 4 disposed on the printed wiring board 1 illustrated in FIG. 1. As illustrated in FIG. 2(A), the EBG structure 4 is configured by a plurality of EBG unit cells 41. FIG. 2(A) illustrates three EBG unit cells 41 that are selected in the EBG structure 4 illustrated in FIG. 1 and are disposed along the branch 422.

Figure 2B:
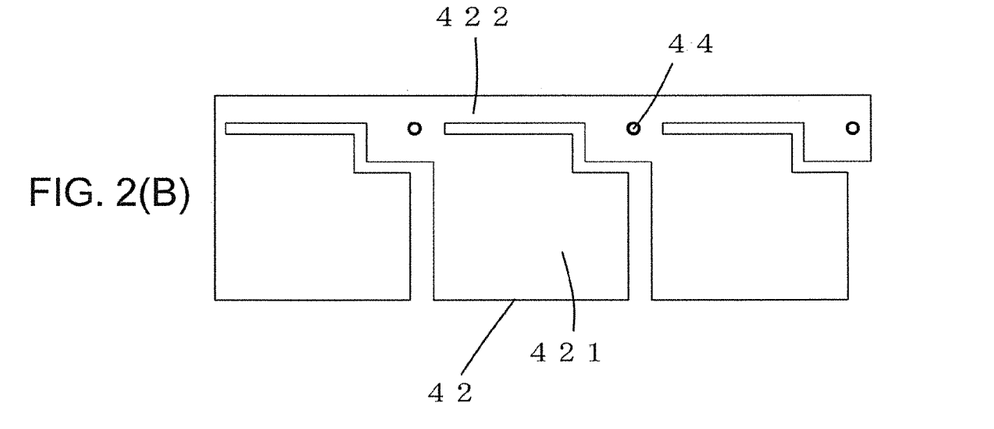
FIG. 2(B) is an explanatory diagram illustrating a power supply layer pattern included in the EBG structure.

The EBG structure 4 includes a power supply layer pattern 42 and capacitive coupling elements 43. The power supply layer pattern 42 is, as illustrated in FIG. 2(B), configured by power supply layer electrodes 421 and the branch 422. That is, the power supply layer pattern 42 is divided into the power supply layer electrodes 421 and the branch 422 by partially forming slits on the power supply layer 2. The power supply layer electrodes 421 have an approximately rectangular shape, and are connected by a portion of the branch 422. The capacitive coupling elements 43 are disposed so as to be superimposed on the power supply layer electrodes 421, respectively, and both of them are capacitively coupled. A capacitive coupling element wire 432 extends from a portion of the capacitive coupling element 43, and a leading end of the capacitive coupling element wire 432 is connected to the branch 422 through a via 44.

Figure 2C:
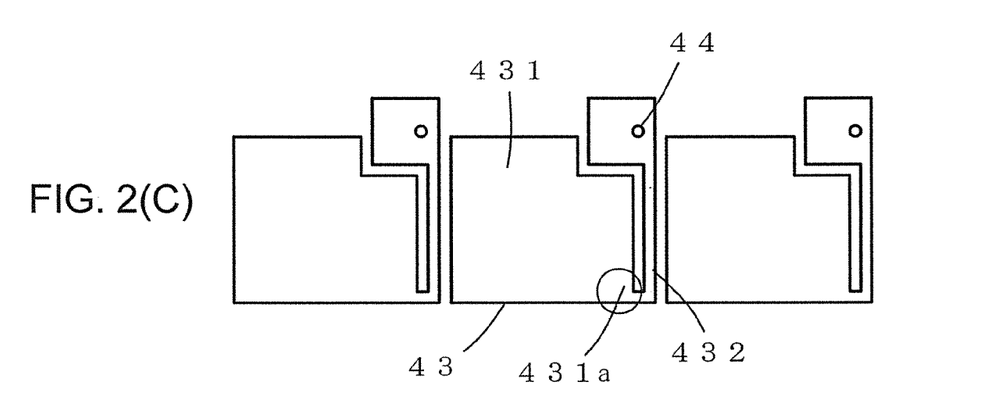
FIG. 2(C) is an explanatory diagram illustrating a capacitive coupling element included in the EBG structure.

The capacitive coupling element 43 is, as illustrated in FIG. 2(C), configured by a capacitive coupling element body 431 and the capacitive coupling element wire 432. The capacitive coupling element 43 is formed by an electrically conductive material such as copper. The capacitive coupling element 43 may be formed by an electrically conductive material identical to the material of the power supply layer pattern 42. The capacitive coupling element body 431 has an approximately rectangular shape, and is approximately equal in a size to the power supply layer electrode 421. On the other hand, the capacitive coupling element wire 432 extends from a corner portion 431a of the capacitive coupling element body 431 to a direction where the branch 422 extends.

The power supply layer electrode 421 and the capacitive coupling element 43 are capacitively coupled with each other through the insulating layer 5. On the other hand, a portion of the power supply layer electrode 421 is connected to the branch 422, and simultaneously a leading end of the capacitive coupling element wire 432 is connected to the branch 422 through the via. The capacitive coupling element wire 432 extends from the capacitive coupling element 43. The via is formed by an electrically conductive material such as copper.

Figure 3:
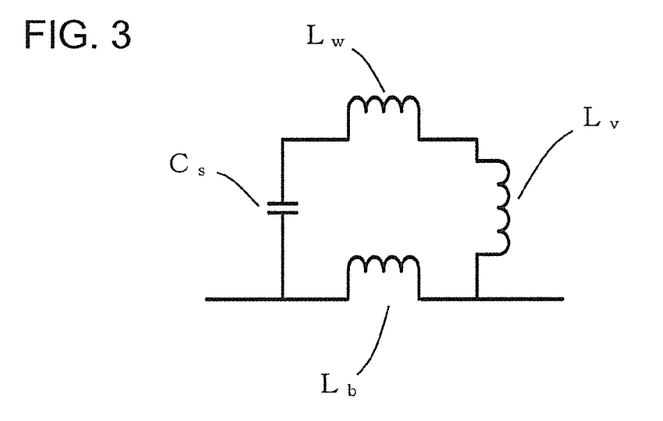
FIG. 3 illustrates an equivalent circuit of a resonance circuit portion included in EBG unit cells configuring the EBG structure illustrated in FIG. 2(A).

FIG. 3 illustrates an equivalent circuit of a resonance circuit portion included in the EBG unit cells 41 configuring the EBG structure 4. In FIG. 3, respective symbols represent the followings.

Lb: an inductance component of a branch portion.
Cs: a coupling capacitance of the power supply layer pattern and the capacitive coupling element.
Lv: an inductance component of a via portion that connects the power supply layer pattern and the capacitive coupling element.
Lw: an inductance component of a capacitive coupling element wire portion that makes a connection from the capacitive coupling element through the via.

A thickness of the interlayer between the power supply layer pattern 42 and the capacitive coupling element 43 is not particularly limited. The thickness of the interlayer between the power supply layer pattern 42 and the capacitive coupling element 43 may be equal to or less than 25 μm in order to provide a coupling capacitance Cs between the power supply layer pattern 42 and the capacitive coupling element 43. In order to sufficiently provide the coupling capacitance Cs, the thickness of the interlayer may be equal to or less than 10 to 20 μm.

In the EBG structure 4, the coupling capacitance Cs is connected to an inductance Lv through the inductance Lw, and resonance is caused by using the inductance Lb to be generated in the branch 422 formed to surround at least a portion of the power supply layer electrode 421. In the capacitive coupling element 43, a path of the capacitive coupling element wire 432 is lengthened to surround at least a portion of the capacitive coupling element body 431. In such a manner the inductance Lw is increased. As a result, from all appearance, the coupling capacitance Cs can be increased, and thus a parallel resonance frequency can be reduced. This means that the EBG unit cell 41 can be downsized, and as a result, the EBG structure 4 can be downsized. The size of the EBG unit cell 41 may be, in a case of an approximately rectangular shape, for example, equal to or less than 3 mm by 3 mm, or may be equal to or less than 1.5 mm by 1.5 mm.

Figure 4:
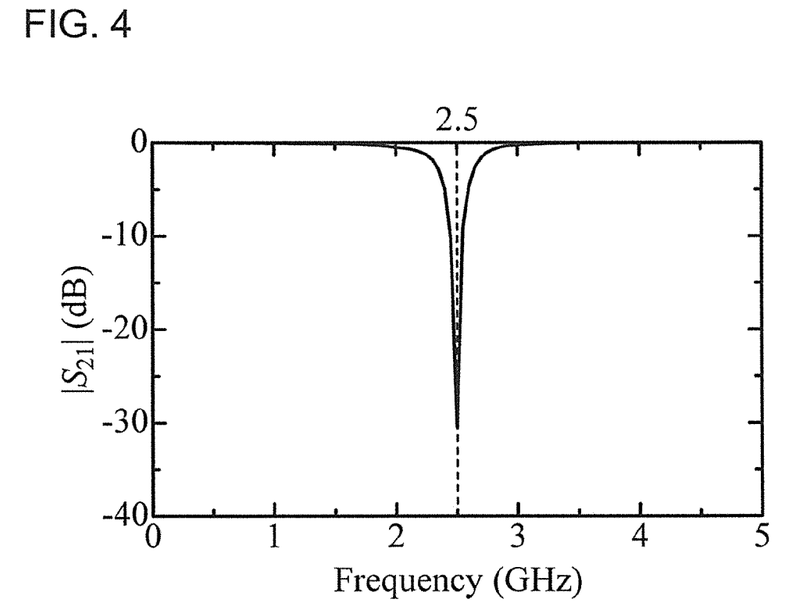
FIG. 4 is a graph illustrating an electromagnetic field simulation result for obtaining a resonance frequency of the resonance circuit in the EBG unit cells illustrated in FIG. 2(A).

FIG. 4 is a graph illustrating an electromagnetic field simulation result for obtaining the resonance frequency of the resonance circuit in the EBG unit cell 41. As is clear from a resonance analysis result, although the EBG unit cell is 1.95 mm×1.85 mm, a prevention area where electromagnetic noise propagation is suppressed at a band of about 2.4 GHz can be set in the EBG structure 4.

The EBG structure provided in the printed wiring board according to another embodiment of the present disclosure will be described below with reference to FIGS. 5(A) to 5(C).

Figure 5A:
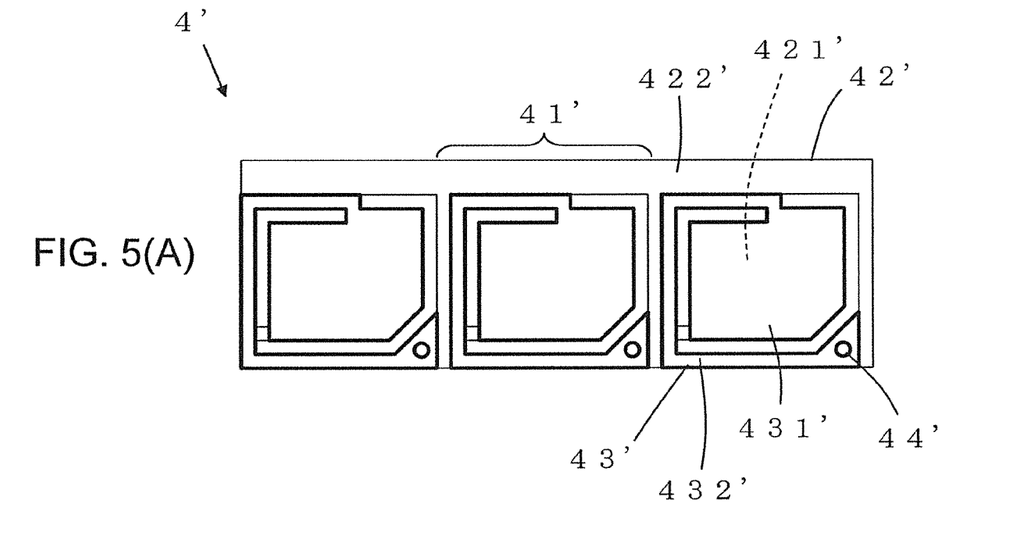
FIG. 5(A) is an explanatory diagram illustrating the EBG structure according to another embodiment.

FIG. 5(A) illustrates a portion of the EBG structure 4 disposed on the printed wiring board 1 illustrated in FIG. 1. As illustrated in FIG. 5(A), an EBG structure 4' is configured by a plurality of EBG unit cells 41'. FIG. 5(A) illustrates three EBG unit cells 41' that are disposed along the branch 422 in the EBG structure 4 illustrated in FIG. 1.

The EBG unit cell 41' illustrated in FIG. 5(A) and the EBG unit cell 41 illustrated in FIG. 2(A) are different from each other in a length between the power supply layer wire 423 disposed on the power supply layer pattern and a capacitive coupling element wire 432' disposed on the capacitive coupling element. That is, in the EBG unit cell 41 illustrated in FIG. 2(A), as illustrated in FIG. 2(B), no power supply layer wire is present in the power supply layer pattern 42, and as illustrated in FIG. 2(C), the capacitive coupling element wire 432 of the capacitive coupling element 43 has a length approximately equal to one side of the capacitive coupling element body 431 having the rectangular shape. On the other hand, in the EBG unit cell 41' illustrated in FIG. 5(A), the power supply layer wire 423 of the power supply layer pattern 42' and the capacitive coupling element wire 432' of the capacitive coupling element 43' surround an approximately one side and an approximately half periphery of the power supply layer electrode 421' having an approximately rectangular shape and an approximately one side and an approximately half periphery of the capacitive coupling element body 431' having an approximately rectangular shape as illustrated in FIGS. 5(B) and 5(C).

Figure 5B:
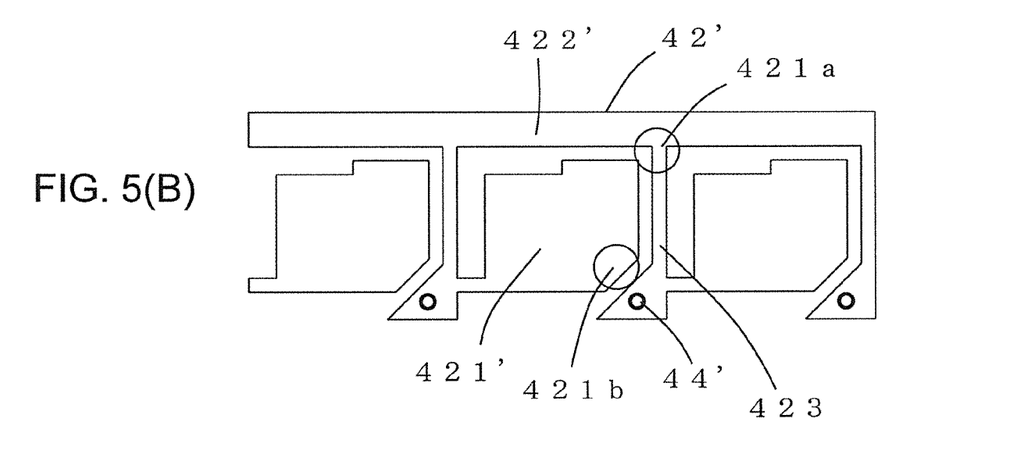
FIG. 5(B) is an explanatory diagram illustrating the power supply layer pattern included in the EBG structure.

Specifically, as illustrated in FIG. 5(B), the power supply layer pattern 42' is divided into the power supply layer electrodes 421', the branch 422', and the power supply layer wires 423 by forming slits partially on the power supply layer 2. The power supply layer electrode 421' has an approximately rectangular shape. The power supply layer wire 423 is approximately equal in a length to one side of the power supply layer electrode 421' between a corner portion 421a of the power supply layer electrode 421' and a corner portion 421b adjacent to the corner portion 421a. A leading end of the branch 422' is connected to the one corner portion of the power supply layer electrode 421' through the adjacent power supply layer wire 423. The branch 422' and the corner portion of the power supply layer electrode 421' may be partially connected to each other directly without through the adjacent power supply layer wire 423.

Figure 5C:
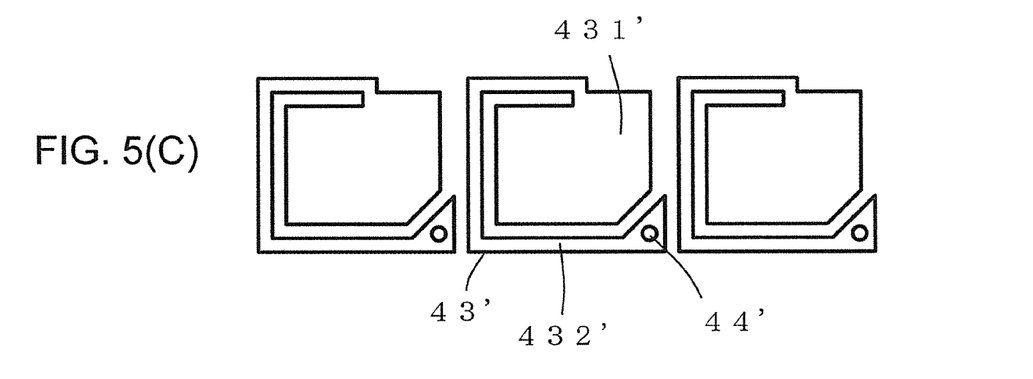
FIG. 5(C) is an explanatory diagram illustrating the capacitive coupling element included in the EBG structure.

As illustrated in FIG. 5(C), the capacitive coupling element body 431' has an approximately rectangular shape, and is approximately equal in a size to the power supply layer electrode 421'. The capacitive coupling element wire 432' is formed so as to surround a half or more periphery of the capacitive coupling element body 431' and come approximately to a position where the corner portion 421a of the branch 422' is disposed.

The power supply layer electrode 421' and the capacitive coupling element 43' are capacitively coupled with each other through the insulating layer 5. On the other hand, a portion of the power supply layer electrode 421' is connected to the branch 422' through the adjacent power supply layer wire 423. At the same time, the leading end of the capacitive coupling element wire 432' extending from the capacitive coupling element 43' is connected to the branch 422' through the via. The via is formed by an electrically conductive material such as copper.

The equivalent circuit of the resonance circuit portion included in the EBG unit cells 41' configuring the EBG structure 4' is identical to the equivalent circuit of the resonance circuit portion included in the EBG unit cells 41 configuring the EBG structure 4 illustrated in FIG. 3. In the power supply layer pattern 42', the power supply layer wire 423 that is not present in the power supply layer pattern 42 is formed. Further, in the capacitive coupling element 43', the path of the capacitive coupling element wire 432' is made to be longer than the path of the capacitive coupling element 43. For this reason, the inductance Lw that is a sum total of the inductance components of both of them can be made to be larger in EBG unit cells 41' than in EBG unit cells 41. Since the coupling capacitance Cs from all appearance can be increased by increasing the inductance Lw, as a result, the parallel resonance frequency can be made to be low. This means that the EBG unit cells 41' can be further downsized, and thus the EBG structure 4' can be further downsized.

Figure 6:
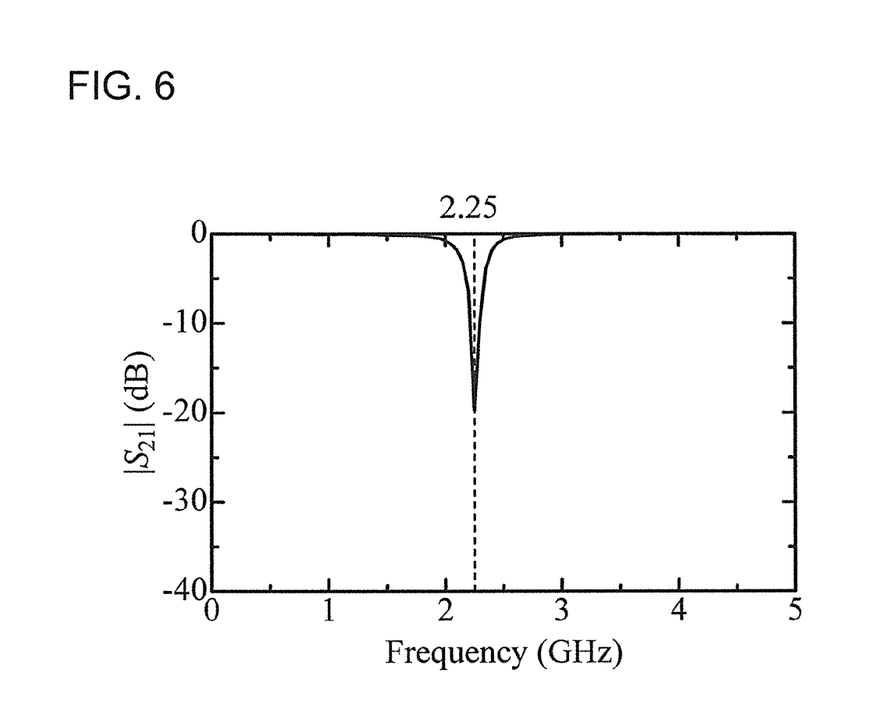
FIG. 6 is a graph illustrating an electromagnetic field simulation result for obtaining the resonance frequency of the resonance circuit in the EBG unit cells illustrated in FIG. 5(A).

FIG. 6 is a graph illustrating an electromagnetic field simulation result for obtaining the resonance frequency of the resonance circuit in the EBG unit cells 41'. As a result of the resonance analysis, although the EBG unit cell is 1.5 by 1.5 mm, a prevention area where electromagnetic noise propagation is suppressed at a band of 2.4 GHz can be set in the EBG structure 4'.

The printed wiring board of the present disclosure is not limited to the above-described embodiment. For example, the EBG structure 4 and the EBG structure 4' described above include the power supply layer electrode and the capacitive coupling element body having the approximately rectangular shape. However, shapes of the power supply layer electrode and the capacitive coupling element body are not limited, and thus may have, for example, a circular shape, a polygon (pentagon or hexagon) shape, or a shape having a recess.

Further, in the printed wiring board of the present disclosure, a number of the EBG unit cells configuring the EBG structure is not particularly limited. Normally, two to four EBG unit cells may be disposed along the branch.

REFERENCE SIGNS LIST

1: printed wiring board
2: power supply layer
3: ground layer
4: EBG structure
41, 41': EBG unit cell
42, 42': power supply layer pattern
421, 421': power supply layer electrode
421a, 421b: corner portion
422, 422': branch
423: power supply layer wire
43, 43': capacitive coupling element
431, 431': capacitive coupling element body
431a: corner portion
432, 432': capacitive coupling element wire
44, 44': via
5: insulating layer

The invention claimed is:
1. A printed wiring board comprising:
a power supply layer, a via, and a ground layer,
wherein a power supply layer pattern formed in the power supply layer includes a power supply layer electrode and a branch that is a direct-current power feeding path connecting adjacent electromagnetic band gap (EGB) unit cells,
wherein a capacitive coupling element including a capacitive coupling element body is disposed to oppose the power supply layer electrode with an interlayer being provided between the capacitive coupling element and the power supply layer electrode,
wherein the power supply layer pattern further includes a power supply layer wire that extends from the power supply layer electrode to surround at least a portion of a periphery of the power supply layer electrode, or the capacitive coupling element further includes a capacitive coupling element wire that extends from the capacitive coupling element body to surround at least a portion of a periphery of the capacitive coupling element body, or the power supply layer pattern further includes the power supply layer wire and the capacitive coupling element further includes the capacitive coupling element wire,
wherein the via is disposed at an end of the capacitive coupling element wire, and wherein the power supply layer pattern and the capacitive coupling element form an EBG structure in which the EBG unit cells are disposed at regular intervals, the EBG unit cells being disposed through the via connected to at least one of the power supply layer wire and the capacitive coupling element wire.

2. The printed wiring board according to claim 1,
wherein the power supply layer electrode and the capacitive coupling element body have an approximately rectangular shape and an approximately equal size,
wherein the branch extends from one corner portion of the power supply layer electrode to near an adjacent corner portion, the branch and the power supply layer electrode being divided by forming a slit,
wherein the capacitive coupling element wire extends from a corner portion of the capacitive coupling element body toward location where the branch extends, and
wherein a leading end of the branch and a leading end of the capacitive coupling element wire are connected to each other at leading ends through a via.

3. The printed wiring board according to claim 1,
wherein the power supply layer electrode and the capacitive coupling element body have an approximately rectangular shape and an approximately equal size, the power supply layer wire has a length approximately equal to at least one side of a periphery of the power supply layer electrode, and the capacitive coupling element wire surrounds at least a half of a periphery of the capacitive coupling element body, and
wherein a leading end of the power supply layer wire and a leading end of the capacitive coupling element wire are connected to each other at leading ends through a via.

4. The printed wiring board according to claim 1, wherein a thickness of the interlayer between the power supply layer pattern and the capacitive coupling element is equal to or less than 25 µm.

5. A printed wiring board comprising:
a power supply layer, a via, and a ground layer,
wherein a power supply layer pattern formed in the power supply layer includes a power supply layer electrode and a branch that is a direct-current power feeding path connecting adjacent electromagnetic band gap (EGB) unit cells,
wherein a capacitive coupling element including a capacitive coupling element body is disposed to oppose the power supply layer electrode with an interlayer being provided between the capacitive coupling element and the power supply layer electrode,
wherein the power supply layer pattern further includes a power supply layer wire that extends from the power supply layer electrode to surround at least a portion of a periphery of the power supply layer electrode, or the capacitive coupling element further includes a capacitive coupling element wire that extends from the capacitive coupling element body to surround at least a portion of a periphery of the capacitive coupling element body, or the power supply layer pattern further includes the power supply layer wire and the capacitive coupling element further includes the capacitive coupling element wire,
wherein the power supply layer electrode and the capacitive coupling element body have an approximately rectangular shape and an approximately equal size,
wherein the branch extends from one corner portion of the power supply layer electrode to near an adjacent corner portion, the branch and the power supply layer electrode being divided by forming a slit,
wherein the capacitive coupling element wire extends from a corner portion of the capacitive coupling element body toward location where the branch extends,
wherein a leading end of the branch and a leading end of the capacitive coupling element wire are connected to each other at leading ends through the via, and
wherein the power supply layer pattern and the capacitive coupling element form an EBG structure in which the EBG unit cells are disposed at regular intervals, the EBG unit cells being disposed through the via connected to at least one of the power supply layer wire and the capacitive coupling element wire.

6. A printed wiring board comprising:
a power supply layer, a via, and a ground layer,
wherein a power supply layer pattern formed in the power supply layer includes a power supply layer electrode and a branch that is a direct-current power feeding path connecting adjacent electromagnetic band gap (EGB) unit cells,
wherein a capacitive coupling element including a capacitive coupling element body is disposed to oppose the power supply layer electrode with an interlayer being provided between the capacitive coupling element and the power supply layer electrode,
wherein the power supply layer pattern further includes a power supply layer wire that extends from the power supply layer electrode to surround at least a portion of a periphery of the power supply layer electrode, or the capacitive coupling element further includes a capacitive coupling element wire that extends from the capacitive coupling element body to surround at least a portion of a periphery of the capacitive coupling element body, or the power supply layer pattern further includes the power supply layer wire and the capacitive coupling element further includes the capacitive coupling element wire,
wherein the power supply layer electrode and the capacitive coupling element body have an approximately rectangular shape and an approximately equal size, the power supply layer wire has a length approximately equal to at least one side of a periphery of the power supply layer electrode, and the capacitive coupling element wire surrounds at least a half of a periphery of the capacitive coupling element body,
wherein a leading end of the power supply layer wire and a leading end of the capacitive coupling element wire are connected to each other at leading ends through the via, and
wherein the power supply layer pattern and the capacitive coupling element form an EBG structure in which the EBG unit cells are disposed at regular intervals, the EBG unit cells being disposed through the via connected to at least one of the power supply layer wire and the capacitive coupling element wire.

* * * * *